United States Patent
Doyle et al.

(10) Patent No.: US 7,526,054 B2
(45) Date of Patent: Apr. 28, 2009

(54) METHOD, ARTICLE, AND APPARATUS FOR A DYNAMIC PHASE DELAY COMPENSATOR

(75) Inventors: David Doyle, Quincy, MA (US);
Hossain Hajimowlana, Merrimack, NH (US); Kevin Gagne, Hampstead, NH (US); Joseph Bastos, Burlington, MA (US); Chirag Patel, Methuen, MA (US)

(73) Assignee: Analog Devices, Inc., Norwood, MA (US)

( * ) Notice: Subject to any disclaimer, the term of this patent is extended or adjusted under 35 U.S.C. 154(b) by 643 days.

(21) Appl. No.: 11/072,562

(22) Filed: Mar. 4, 2005

(65) Prior Publication Data
US 2006/0198480 A1 Sep. 7, 2006

(51) Int. Cl.
*H04L 7/00* (2006.01)

(52) U.S. Cl. .............. 375/355; 375/376; 375/364; 375/219; 370/505; 370/503; 710/100; 710/306

(58) Field of Classification Search ............ 375/355, 375/376, 364, 219; 713/401; 370/503, 505; 710/100, 306
See application file for complete search history.

(56) References Cited

U.S. PATENT DOCUMENTS

| | | | | |
|---|---|---|---|---|
| 5,666,079 A | * | 9/1997 | Ma .......................... | 327/276 |
| 6,262,998 B1 | * | 7/2001 | Hogeboom ................ | 370/503 |
| 6,282,592 B1 | * | 8/2001 | Aston et al. ............... | 710/100 |
| 6,725,390 B1 | * | 4/2004 | Liu et al. .................. | 713/401 |
| 6,839,860 B2 | * | 1/2005 | Lin .......................... | 713/401 |
| 6,876,239 B2 | * | 4/2005 | Bell ......................... | 327/158 |

* cited by examiner

*Primary Examiner*—Chieh M. Fan
*Assistant Examiner*—Eva Puente
(74) *Attorney, Agent, or Firm*—Kenyon & Kenyon LLP

(57) ABSTRACT

An apparatus, method, and article to dynamically adjust a data signal using a regenerated clock signal in an emulator to increase communication speed between the emulator and the evaluation board is disclosed. In one embodiment, this is achieved by applying a reference clock signal at a predetermined frequency to a digital circuit. A delayed return data signal is then sampled from the digital circuit. The sampled delayed return data signal is then compared to an expected return data signal. The delayed return data signal is then adjusted as a function of the comparison to increase the communication speed between the emulator and the evaluation board.

9 Claims, 2 Drawing Sheets

METHOD, ARTICLE, AND APPARATUS FOR A DYNAMIC PHASE DELAY COMPENSATOR

FIELD OF THE INVENTION

The present invention is related to digital synchronous circuits, and more particularly to a digital delay lock loop circuit.

BACKGROUND OF THE INVENTION

Clock signals are used in virtually every IC and electronic system to control timing. For example, every time there is a rising edge on a clock signal, all the latches in a circuit may change state. Many DSP (digital signal processor) tools employ DSP evaluation boards to evaluate DSPs. These DSP evaluation boards are often debugged using an emulator, which are also referred to as in-circuit emulator (ICE). The emulators are hardware tools that are generally used for software development, including testing in real-time. They also facilitate in modifying and displaying data stored in memories and registers, which can help verify the operation of a system hardware and software. With advances in high-speed DSPs that can handle complicated and larger application, higher seed emulators can significantly reduce application development time.

However, the communication speed between the emulator and the evaluation board is limited by the delay introduced in the digital circuit included between them. Thus, to improve the communication speed and the performance between the evaluation board and the emulator, the delay introduced in the digital circuit has to be compensated and/or reduced.

One conventional technique compensates such delay between the emulator and the evaluation board using a bit error test (i.e., by raising the clock frequency until communication from the evaluation board fails, and then selecting a slightly lower frequency). This technique does not adjust the skew to synchronize the sample clock with delayed returning data rather it simply finds the failure point in the system by decreasing the sampling period (i.e., by increasing the frequency). This can lead to a less than desired operating frequency.

Another conventional technique uses a user-specified clock from the evaluation board to clock data back to the emulator. This clock automatically includes/accounts for the timing delays introduced by the evaluation board. This approach requires adding another pin to the evaluation board.

SUMMARY OF THE INVENTION

According to a first aspect of the invention there is provided a method of dynamically adjusting a data clock in a digital circuit, the method comprising the steps of applying a reference clock signal at a predetermined frequency to the digital circuit and a delayed clock circuit, sampling a delayed return data signal from the digital circuit by the delayed reference clock generator, comparing the sampled delayed return data signal to an expected return data signal by the delayed reference clock generator, if the delayed return data signal is equal to the expected return data signal, then using the applied reference clock signal in the digital circuit to communicate between the digital circuit and the emulator, and if the delayed return data signal is not equal to the expected return data signal, then adjusting for a delay in the delayed return data signal by varying the delay of the sample clock signal until the delayed return data signal is equal to the expected return data signal.

According to a second aspect of the invention there is provided an article including a storage medium having instructions that, when executed by a computing platform, result in execution of a method for dynamically adjusting a data clock, the method comprising the steps of applying a reference clock signal at a predetermined frequency to the digital circuit and a delayed clock circuit, sampling a delayed return data signal from the digital circuit by the delayed reference clock generator, comparing the sampled delayed return data signal to an expected return data signal by the delayed reference clock generator, if the delayed return data signal is equal to the expected return data signal, then using the applied reference clock signal in the digital circuit to communicate between the digital circuit and the emulator, and if the delayed return data signal is not equal to the expected return data signal, then adjusting for a delay in the delayed return data signal by varying the delay of the sample clock signal until the delayed return data signal is equal to the expected return data signal.

According to a third aspect of the invention there is provided an apparatus for dynamically adjusting a data clock in a digital circuit, the apparatus comprising a digital circuit and an emulator coupled to the digital circuit, wherein the emulator further comprising, a reference clock generator that generates and applies a reference clock signal at a predetermined frequency to the digital circuit, a delayed reference clock generator that samples a delayed return data signal from the digital circuit, wherein the delayed reference clock generator determines whether the delayed return data signal is equal to the expected return data signal, and a serial protocol generator that uses the applied reference clock signal in the digital circuit to communicate between the digital circuit and the emulator, if the delayed return data signal is equal to the expected return data signal, and wherein the serial protocol generator adjusts for delay in the delayed return data signal by varying the delay of the sample clock signal until the delayed return data signal is equal to the expected return data signal, if the delayed return data signal is not equal to the expected return data signal.

DESCRIPTION OF PREFERRED EMBODIMENTS

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention.

The leading digit(s) of reference numbers appearing in the Figures generally corresponds to the Figure number in which that component is first introduced, such that the same reference number is used throughout to refer to an identical component which appears in multiple Figures. The same reference number or label may refer to signals and connections, and the actual meaning will be clear from its use in the context of the description.

Figure 1:
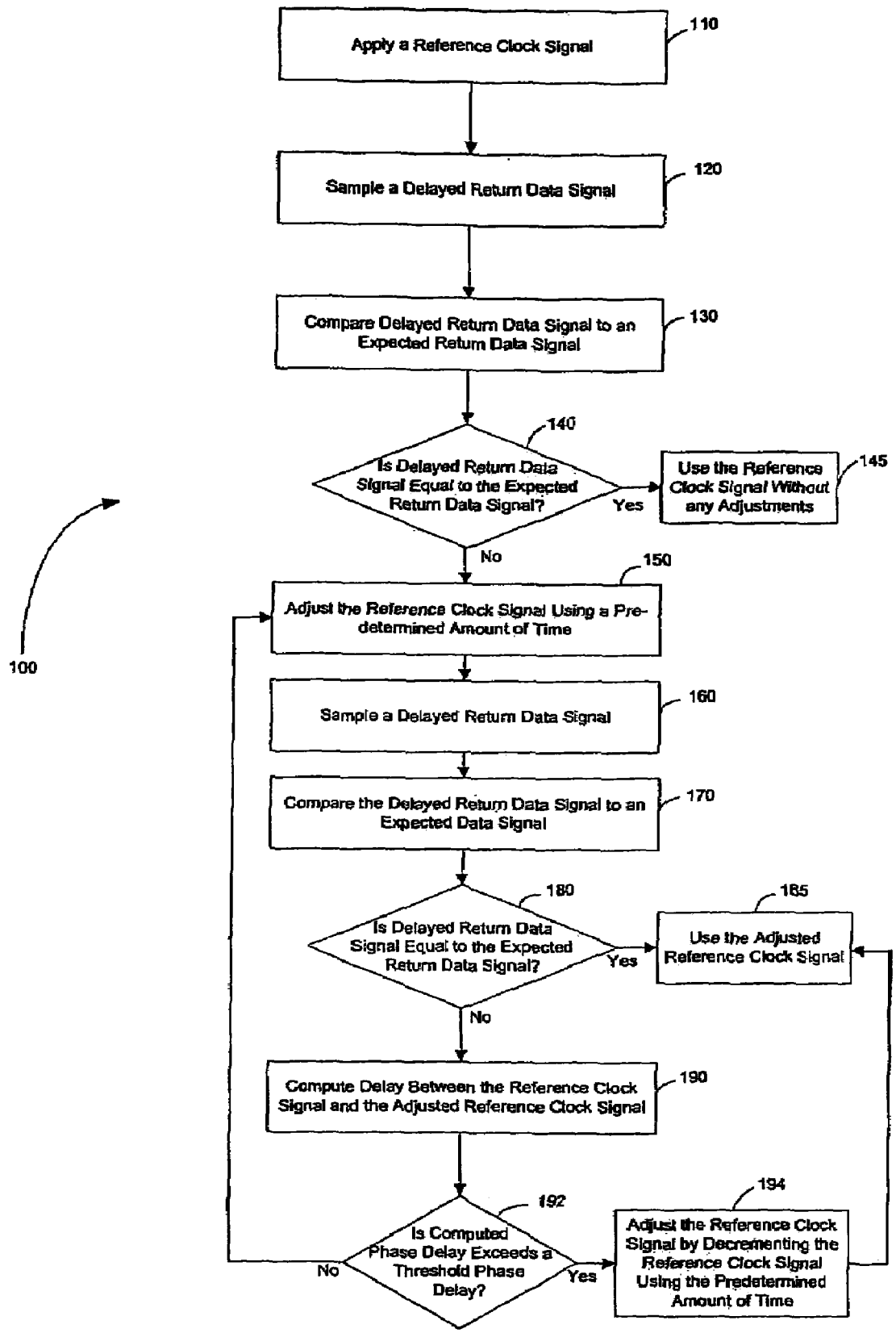
FIG. 1 is a flowchart illustrating an example method of dynamically adjusting a data clock according to an embodiment of the present invention.

FIG. 1 illustrates an example method 100 of dynamically adjusting a data clock in a digital circuit. The digital circuit can include components, such as cables and connectors connecting between the emulator and the evaluation board, PC board circuitry, buffers on the evaluation board and so on. At 110, the method 100 applies a reference clock signal at a predetermined frequency to the digital circuit and a delayed clock circuit.

At 120, a delayed return data signal is sampled from the digital circuit by a delayed reference clock generator. At 130, the sampled delayed return data signal is compared to an expected return data signal by the delayed reference clock generator.

At 140, the method 100 determines whether the delayed return data signal is equal to the expected data signal based on the comparison at step 130. If the delayed return data signal is equal to the expected return data signal, then method goes to step 145. At 145, the applied reference clock signal is used in the digital circuit to communicate between the digital circuit and an emulator. If the delayed return data signal is not equal to the expected return data signal, then the method 100 goes to step 150. At 150, the method 100 adjusts for any delay in the delayed return data signal by varying the delay in the sample clock signal until the delayed return data signal is equal to the expected return data signal. In one embodiment, the method 100 adjusts the reference clock signal using a pre-determined amount of time. The adjusted reference clock signal is then applied to the digital circuit and the delayed clock circuit.

At 160, a delayed return data signal is then sampled from the digital circuit by the delayed reference clock generator. At 170, the sampled delayed return data signal is compared to the expected return data signal by the delayed reference clock generator.

At 180, the method 100 determines whether the delayed return data signal is equal to the expected return data signal based on the comparison at step 170. If the delayed return data signal is equal to the expected return data signal, then the method 100 goes to step 185. At 185, the applied reference clock signal is used in the digital circuit to communicate between the digital circuit and the emulator. If the delayed return data signal is not equal to the expected return data signal, then the method 100 goes to step 190. At 190, the delay between the reference clock signal and the adjusted reference clock signal is computed.

At 192, the method 100 determines whether the computed phase delay between the reference clock signal and the adjusted reference clock signal exceeds a threshold phase delay. If the computed phase delay between the reference clock signal and the adjusted reference clock signal exceeds the threshold phase delay, then the method 100 goes to step 194. At 194, the reference clock signal is adjusted by decrementing the reference clock signal using the predetermined amount of time. The adjusted referenced clock signal is then used to communicate between the emulator and the digital circuit. If the computed phase delay between the reference clock signal and the adjusted reference clock signal does not exceed the threshold phase delay, then the method 100 goes to step 150 and repeats the steps 150-194 until the delayed return data signal is equal to the expected data signal.

In some embodiments, the reference clock signal is adjusted by initializing the reference clock signal to have a zero delay. The initialized reference clock signal is then adjusted by incrementing it by 250 picoseconds. The delay between the reference clock signal and the adjusted referenced clock signal is then computed. The computed phase delay is then compared with the threshold phase delay. If the computed phase delay is greater than or equal to the threshold phase delay based on the comparison, then the reference clock signal is decremented by 5 MHz. If the computed phase delay is less than the threshold phase delay based on the comparison, then the above steps are repeated until the computed phase delay is less than the threshold phase delay.

Although the flowchart 100 includes steps 110-194 that are arranged serially in the exemplary embodiments, other embodiments of the subject matter may be implemented using multiple processors or a single processor organized as two or more virtual machines or sub-processors. Moreover, still other embodiments may implement the steps as two or more specific interconnected hardware modules with related control and data signals communicated between and through the modules, or as portions of an application-specific integrated circuit. Thus, the exemplary process flow diagrams are applicable to software, firmware, and/or hardware implementations.

Figure 2:
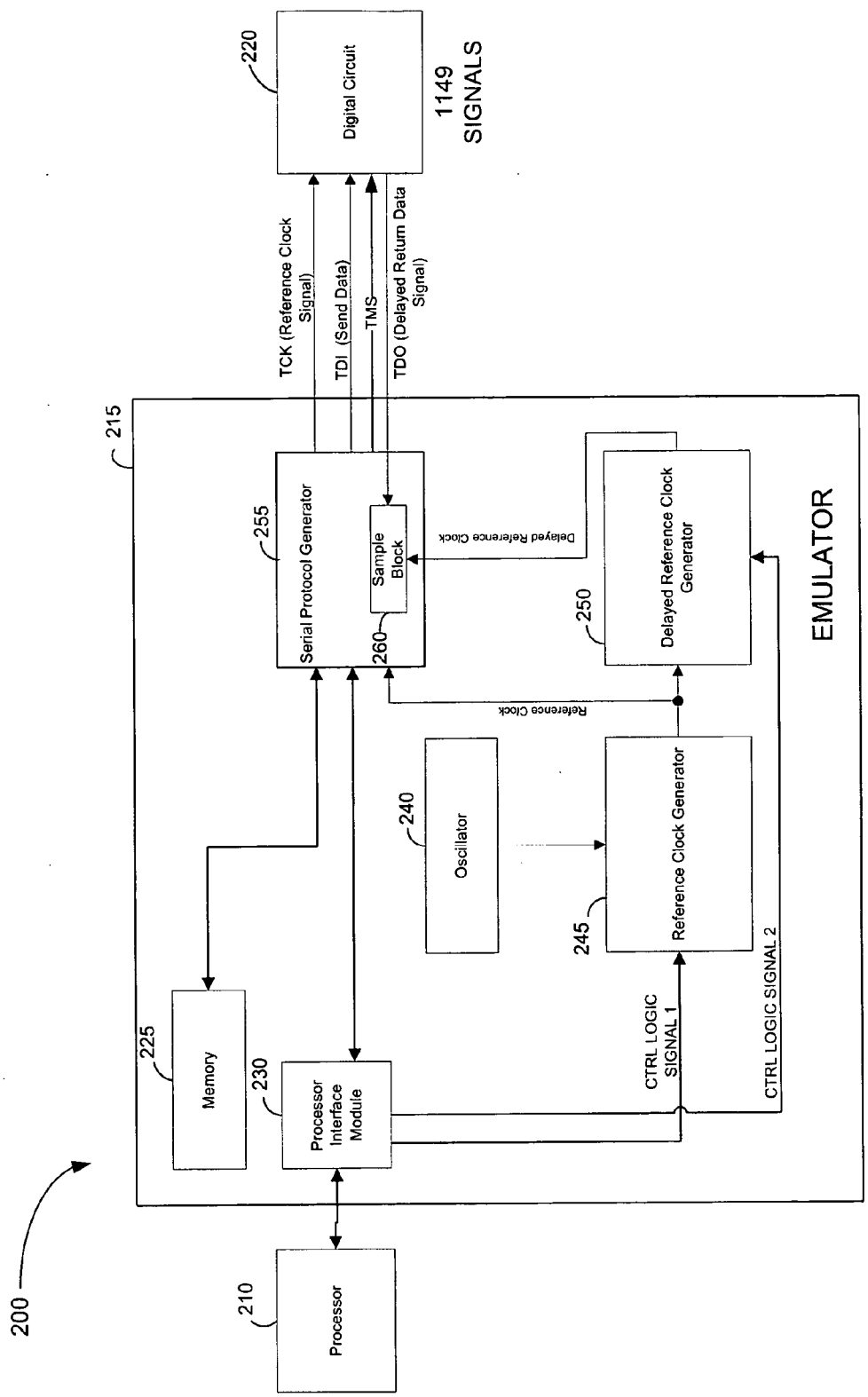
FIG. 2 is a block diagram of an apparatus for dynamically adjusting the data clock according to an embodiment of the present invention.

Referring now to FIG. 2 there is illustrated an apparatus 200 according to an embodiment of the present invention. The apparatus 200 includes a processor 210, an emulator 215, and a digital circuit 220. For example, the digital circuit 220 can include components, such as cables and connectors connecting between the emulator and an evaluation board, PC board circuitry, buffers on the evaluation board, and so on.

As shown in FIG. 2, the emulator 215 includes memory 225, a processor interface module 230, an oscillator 240, a reference clock generator 245, a delayed reference clock generator 250, and a serial protocol generator 255. Further as shown in FIG. 2, the serial protocol generator 255 includes a sample block 260.

In some embodiments, the emulator 215 is a JTAG based emulator, which uses a dedicated communication channel called Test Access Port (TAP) to access the DSP which is non-intrusive to the system. The TAP is a general-purpose port that can provide access to many test support functions built into a DSP. It is composed as a minimum of three input signal of test clock (TCK), test data input (TDI), and test mode select (TMS) and one output signal called test data output (TDO) as shown in FIG. 2. An optional fourth input signal of test access port reset (TRST) provides for asynchronous initialization of the test logic.

The TCK input signal is an input clock to the test logic in DSP, which is independent of the DSP core clock. The dedicated TCK input is included so that the serial test data path between components in the JTAG chain can be used independently of components of specific system clocks, which may vary significantly in frequency from one component to the next. It also permits shifting of test data concurrently with system operation of the component. The latter facility is required to support the use of the TAP and test data registers in a design for on-line system monitoring. For specific requirement and relation between the DSP core and TCK refer to the timing information on the JTAG signals in DP manual.

The TMS is an input signal to the TAP controller to control test operation. To ensure race-free operations. The TMS input signal is generated on the falling edge of the TCK input signal on the controller side and sampled on the rising edge of the TCK by the test logic on the target side.

The TDI is a serial data input signal for the test logic. To ensure race-free operation, the TDI input signal is generated on the falling edge of the TCK input signal on the controller side and sampled on the rising edge of the TCK by the test logic on the target side.

The TDO is the serial output signal from the test logic. To ensure race-free operation, the TDO output signal is generated on the falling edge of the TCK input signal by the test logic and sampled on the rising edge of the TCK input signal by the controller.

In operation, in one example embodiment, the reference clock generator 245 generates a reference clock signal and applies the generated reference clock signal at a predetermined frequency to the digital circuit 220. The delayed reference clock generator 250 then samples a delayed return data signal coming from the digital circuit 220. The delayed reference clock generator 250 then determines whether the delayed return data is equal to the expected return data signal.

Based on the determination by the delayed reference clock generator 250, if the delayed return data signal is equal to the expected return data signal, then the serial protocol generator 255 uses the applied reference clock signal in the digital circuit 220 to communicate between the digital circuit 220 and the emulator 215. Based on the determination by the delayed reference clock generator 250, if the delayed return data signal is not equal to the expected return data signal, then the serial protocol generator 255 adjusts for any delay in the sampled delayed return data signal by varying the delay of the sample clock signal until the delayed return data signal is equal to the expected return data signal to enhance communication speed between the digital circuit 220 and the emulator 215.

In some embodiments, the serial protocol generator 255 adjusts the reference clock signal using a predetermined amount of time. In these embodiments, the serial protocol generator 255 applies the adjusted reference clock signal to the digital circuit 220. The delayed reference clock generator 250 then samples the delayed return data signal received from the digital circuit 220. The delayed reference clock generator 250 then compares the sampled delayed return data signal to the expected return data signal.

Further in these embodiments, based on the comparison by the delayed reference clock generator 250, if the delayed return data signal is equal to the expected return data signal, then the serial protocol generator 255 uses the applied reference clock signal to communicate between the digital circuit 220 and the emulator 215.

Based on the comparison by the delayed reference clock generator 250, if the delayed return data signal is not equal to the expected return data signal, then the serial protocol generator 255 computes any delay existing between the reference clock signal and the adjusted reference clock signal. The serial protocol generator 255 then determines whether the computed phase delay exceeds a threshold phase delay. Based on the determination by the serial protocol generator 255, if the computed phase delay exceeds the threshold phase delay, then the serial protocol generator 255 adjusts the reference clock signal by decrementing the reference clock signal using the predetermined amount of time and uses the adjusted reference clock signal to communicate between the emulator 215 and the digital circuit 220. Based on the determination by the serial protocol generator, if the computed phase delay does not exceed the threshold phase delay, then the serial protocol generator 255 repeats the adjusting of the reference clock signal until the delayed return data signal is equal to the expected data signal and uses the adjusted reference clock signal to communicate between the emulator 215 and the digital circuit 220. In these embodiments, if the computed phase delay is equal to the threshold phase delay, then the serial protocol generator 255 uses the reference clock signal without any adjustment to communicate between the emulator 215 and the digital circuit 220.

In some embodiments, the serial protocol generator 255 initializes the reference clock signal to have a zero delay. The serial protocol generator 255 then adjusts the reference clock signal in increments of approximately about 250 picoseconds. The serial protocol generator 255 then compares the computed phase delay to the threshold phase delay. Based on the comparison, if the computed phase delay is greater than or equal to the threshold phase delay, the serial protocol generator 255 decrements the reference clock signal by about 5 MHz and uses the decremented reference clock signal to communicate between the emulator 215 and the digital circuit 220. Based on the comparison, if the computed phase delay is less than the threshold phase delay, the serial protocol generator 255 repeats adjusting of the reference clock signal until the computed phase delay is equal to or greater than the threshold phase delay and uses the adjusted reference clock signal to communicate between the emulator 215 and the digital circuit 220.

High speed scan based emulators can be achieved by increasing host to emulator 215 communication speed. Using low pass and low propagation delay cable for emulator 215—target link and high speed buffers for JTAG signals. In existing JTAG scan based emulator—target link delay is the limiting factor to achieve a higher TCK input signal. Generally, the delay elements in the emulator 215—target link, are buffers between the cable connecting the emulator 215 and target and connectors used in the link.

It is to be understood that the above-description is intended to be illustrative, and not restrictive. Many other embodiments will be apparent to those of skill in the art upon reviewing the above-description. The scope of the subject matter should, therefore, be determined with reference to the following claims, along with the full scope of equivalents to which such claims are entitled.

As shown herein, the present invention can be implemented in a number of different embodiments, including various methods, a circuit, an I/O device, a system, and an article comprising a machine-accessible medium having associated instructions.

Other embodiments will be readily apparent to those of ordinary skill in the art. The elements, algorithms, and sequence of operations can all be varied to suit particular requirements. The operations described-above with respect to the method illustrated in FIG. 2 can be performed in a different order from those shown and described herein.

FIGS. 1 and 2 are merely representational and are not drawn to scale. Certain portions thereof may be exaggerated, while others may be minimized. FIGS. 1-2 illustrate various embodiments of the invention that can be understood and appropriately carried out by those of ordinary skill in the art.

It is emphasized that the Abstract is provided to comply with 37 C.F.R. §1.72(b) requiring an Abstract that will allow the reader to quickly ascertain the nature and gist of the technical disclosure. It is submitted with the understanding that it will not be used to interpret or limit the scope or meaning of the claims.

In the foregoing detailed description of embodiments of the invention, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus, the following claims are hereby incorporated into the detailed description of embodiments of the invention, with each claim standing on its own as a separate embodiment.

It is understood that the above description is intended to be illustrative, and not restrictive. It is intended to cover all alternatives, modifications and equivalents as may be included within the spirit and scope of the invention as defined in the appended claims. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein," respectively.

What is claimed is:

1. A method of communicating between an emulator and an evaluation board including a digital circuit comprising:
   applying a reference clock signal at a predetermined frequency to the digital circuit and a delayed clock circuit;
   sampling a delayed return data signal from the digital circuit by a delayed reference clock generator;
   comparing the sampled delayed return data signal to an expected return data signal by the delayed reference clock generator;
   if the delayed return data signal is equal to the expected return data signal, then using the applied reference clock signal in the digital circuit to communicate between the digital circuit and the emulator; and
   if the delayed return data signal is not equal to the expected return data signal, then adjusting a delay in the delayed return data signal by varying a delay of the reference clock signal until the delayed return data signal is equal to the expected return data signal, wherein adjusting the delay in the delayed return data signal by varying the delay of the reference clock signal until the delayed return data signal is equal to the expected return data signal comprises:
   adjusting the reference clock signal using a predetermined amount of time;
   applying the adjusted reference clock signal to the digital circuit and the delayed clock circuit;
   sampling the delayed return data signal from the digital circuit by the delayed reference clock generator;
   comparing the sampled delayed return data signal to the expected return data signal generated by the delayed reference clock generator;
   if the delayed return data signal is equal to the expected return data signal, then using the applied adjusted reference clock signal in the digital circuit to communicate between the digital circuit and the emulator;
   if the delayed return data signal is not equal to the expected return data signal, then computing a delay between the reference clock signal and the adjusted reference clock signal;
   determining that the computed phase delay exceeds a threshold phase delay; if so, then adjusting the reference clock signal by decrementing the reference clock signal using the predetermined amount of time and using the adjusted reference clock signal to communicate between the emulator and the digital circuit; and
   if not, then repeating the above adjusting, applying, sampling, comparing and determining steps until the delayed return data signal is equal to the expected return data signal and using the adjusted reference clock signal to communicate between the emulator and the digital circuit.

2. The method of claim 1, wherein adjusting the reference clock signal using a predetermined amount of time comprises:
   initializing the reference clock signal to a zero delay;
   adjusting the referenced clock signal by incrementing the initialized reference clock by about 250 picoseconds;
   computing the delay between the reference clock signal and the adjusted reference clock signal;
   comparing the computed phase delay to the threshold phase delay;
   if the computed phase delay is greater than or equal to the threshold phase delay, then decrementing the reference clock signal by about 5 MHz; and
   repeating the adjusting, comparing, and decrementing steps until the computed phase delay is equal to or greater than the threshold phase delay, if the computed phase delay is less than the threshold phase delay.

3. The method of claim 1, wherein the digital circuit comprises components selected from the group comprising cables and connectors connecting between the emulator and the evaluation board, PC board circuitry, and buffers on the evaluation board.

4. An article comprising:
   a storage medium having instructions that, when executed by a computing platform, result in execution of a method comprising:
   applying a reference clock signal at a predetermined frequency to a digital circuit and a delayed clock circuit;
   sampling a delayed return data signal from a digital circuit by a delayed reference clock generator;
   comparing the sampled delayed return data signal to an expected return data signal by the delayed reference clock generator;
   if the delayed return data signal is equal to the expected return data signal, then using the applied reference clock signal in the digital circuit to communicate between the digital circuit and an emulator; and
   if the delayed return data signal is not equal to the expected return data signal, then adjusting a delay in the delayed return data signal by varying a delay of the reference clock signal until the delayed return data signal is equal to the expected return data signal, wherein adjusting the delay in the delayed return data signal by varying the delay of the reference clock signal until the delayed return data signal is equal to the expected return data signal comprises:
   adjusting the reference clock signal using a predetermined amount of time;
   applying the adjusted reference clock signal to the digital circuit and the delayed clock circuit;
   sampling the delayed return data signal from the digital circuit by the delayed reference clock generator;
   comparing the sampled delayed return data signal to the expected return data signal by the delayed reference clock generator;
   if the delayed return data signal is equal to the expected return data signal, then using the applied adjusted reference clock signal in the digital circuit to communicate between the digital circuit and the emulator;
   if the delayed return data signal is not equal to the expected return data signal, then computing a delay between the reference clock signal and the adjusted reference clock signal; determining that the computed phase delay exceeds a threshold phase delay;
   if so, then adjusting the reference clock signal by decrementing the reference clock signal using the predetermined amount of time and using the adjusted reference clock signal to communicate between the emulator and the digital circuit; and if not, then repeating the above adjusting, applying, sampling, comparing and determining steps until the delayed return data signal is equal to the expected return data signal and using the adjusted reference clock signal to communicate between the emulator and the digital circuit.

5. The article of claim 4, wherein adjusting the reference clock signal using a predetermined amount of time comprises:

initializing the reference clock signal to a zero delay;

adjusting the referenced clock signal by incrementing the initialized reference clock by about 250 picoseconds;

computing the delay between the reference clock signal and the adjusted reference clock signal;

comparing the computed phase delay to the threshold phase delay;

if the computed phase delay is greater than or equal to the threshold phase delay, then decrementing the reference clock signal by 5 MHz; and repeating the adjusting, comparing, and decrementing steps until the computed phase delay is equal to or greater than the threshold phase delay, if the computed phase delay is less than the threshold phase delay.

6. The article of claim 4, wherein the digital circuit comprises components selected from the group comprising cables and connectors connecting between the emulator and an evaluation board, PC board circuitry, and buffers on the evaluation board.

7. An apparatus, comprising:

a digital circuit; and an emulator coupled to the digital circuit, wherein the emulator further comprising:

a reference clock generator that generates and applies a reference clock signal at a predetermined frequency to the digital circuit;

a sample block coupled to a delayed reference clock generator, wherein the sample block samples a delayed return data signal from the digital circuit, wherein the delayed reference clock generator determines whether the delayed return data signal is equal to an expected return data signal; and a serial protocol generator that uses the applied reference clock signal in the digital circuit to communicate between the digital circuit and the emulator, if the delayed return data signal is equal to the expected return data signal, and wherein the serial protocol generator adjusts a delay in the delayed return data signal by varying a delay of the reference clock signal until the delayed return data signal is equal to an expected return data signal, if the delayed return data signal is not equal to the expected return data signal, wherein the serial protocol generator adjust the reference clock signal using a predetermined amount of time, wherein the serial protocol generator applies the adjusted reference clock signal to the digital circuit, wherein the sample block coupled to the delayed reference clock generator samples the delayed return data signal from the digital circuit, wherein the delayed reference clock generator compares the sampled delayed return data signal to the expected return data signal, wherein the serial protocol generator uses the applied reference clock signal, if the delayed return data signal is equal to the expected return data signal to communicate between the digital circuit and the emulator, wherein the serial protocol generator computes a delay between the reference clock signal and the adjusted reference clock signal, if the delayed return data signal is not equal to the expected return data signal, wherein the serial protocol generator determines whether the computed phase delay exceeds a threshold phase delay, wherein the serial protocol generator adjusts the reference clock signal by decrementing the reference clock signal using the predetermined amount of time and uses the adjusted reference clock signal, if the computed phase delay exceeds the threshold phase delay to communicated between the emulator and digital circuit, and wherein the serial protocol generator repeats the adjusting of the reference clock signal until the delayed return data signal is equal to the expected data signal and uses the adjusted reference clock signal, if the computed phase delay does not exceed the threshold phase delay to communicate between the emulator and the digital circuit.

8. The apparatus of claim 7, wherein the serial protocol generator initializes the reference clock signal to a zero delay, wherein the serial protocol generator adjusts the reference clock signal in increments of about 250 picoseconds, wherein the serial protocol generator compares the computed phase delay to the threshold phase delay, wherein serial protocol generator decrements the reference clock signal by 5 MHz, if the computed phase delay is greater than or equal to the threshold phase delay, and wherein the serial protocol generator repeats adjusting of the reference clock signal until the computed phase delay is equal to or greater than the threshold phase delay, if the computed phase delay is less than the threshold phase delay.

9. The apparatus of claim 7, wherein the digital circuit comprises components selected from the group comprising cables and connectors connecting between the emulator and an evaluation board, PC board circuitry, and buffers on the evaluation board.

* * * * *